(12) United States Patent
Kim

(10) Patent No.: US 6,339,003 B1
(45) Date of Patent: Jan. 15, 2002

(54) METHOD OF FABRICATING A SEMICONDUCTOR DEVICE

(75) Inventor: Jae-Young Kim, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/609,390

(22) Filed: Jul. 3, 2000

(30) Foreign Application Priority Data

Aug. 21, 1999 (KR) .............................................. 99-34743

(51) Int. Cl.[7] .................. H01L 21/8236; H01L 21/311; H01L 21/302
(52) U.S. Cl. ...................... 438/287; 438/637; 438/702; 438/740
(58) Field of Search ................................. 438/287, 637, 438/702, 740, 597, 239, 240, 253, 672, 706, 710, 712

(56) References Cited

U.S. PATENT DOCUMENTS

| | | | |
|---|---|---|---|
| 4,966,870 A | | 10/1990 | Barber et al. ................ 438/637 |
| 5,949,092 A | * | 9/1999 | Kadosh et al. ............... 438/158 |
| 6,077,731 A | * | 6/2000 | Yamazaki et al. ........... 438/150 |
| 6,159,839 A | * | 12/2000 | Jeng et al. ................... 438/618 |
| 6,159,844 A | * | 12/2000 | Bothra ........................ 438/637 |

* cited by examiner

Primary Examiner—Matthew Smith
Assistant Examiner—Igwe U. Anya
(74) Attorney, Agent, or Firm—Birch, Stewart, Kolasch & Birch, LLP

(57) ABSTRACT

The present invention relates to a method of fabricating a semiconductor device which reduces leakage current by controlling an etch of a field oxide layer when a contact hole is formed. The present invention includes the steps of forming a field oxide layer defining an active area and a field area on a semiconductor substrate of a first conductive type, forming a gate on the active area of the semiconductor substrate by inserting a gate insulating layer between the semiconductor substrate and the gate, forming impurity regions of a second conductive type in the semiconductor substrate in use of the gate as a mask, forming a first insulating interlayer on the semiconductor substrate by depositing an insulator of which heat expansion coefficient and lattice mismatch less than those of the semiconductor substrate to cover the field oxide layer and the gate, forming a second insulating interlayer on the first insulating interlayer by depositing another insulator of which etch rate is different from that of the first insulating interlayer, forming a third insulating interlayer on the second insulating interlayer by depositing another insulator of which etch rate is different from that of the second insulating interlayer, and forming a first contact hole and second contact holes exposing the gate and heavily doped regions respectively by patterning the third to first insulating interlayer successively by photolithography.

13 Claims, 4 Drawing Sheets

METHOD OF FABRICATING A SEMICONDUCTOR DEVICE

BACKGROUND OF THE INVENTION

1. Field of Invention

The present invention relates to a method of fabricating a semiconductor device which reduces leakage current by controlling an etch of a field oxide layer when a contact hole is formed.

2. Discussion of Related Art

As the integration of a semiconductor device increases, so the size of an unit transistor decreases. Thus, sizes of contact holes exposing impurity regions are reduced as well as the impurity regions for source and drain regions are decreased in size, causing difficulty in process. Besides, leakage current on the operation of the device is brought about by the etch of a field oxide layer due to misalignment in forming the contact holes.

Therefore, a technique of forming a borderless contact has been developed to reduce leakage current by forming the contact hole to be overlapped with a field oxide layer, which provides an easy process and prevents the etch of the field oxide layer.

FIG. 1A to FIG. 1D show cross-sectional views of fabricating a semiconductor device according to a related art.

Figure 1A:
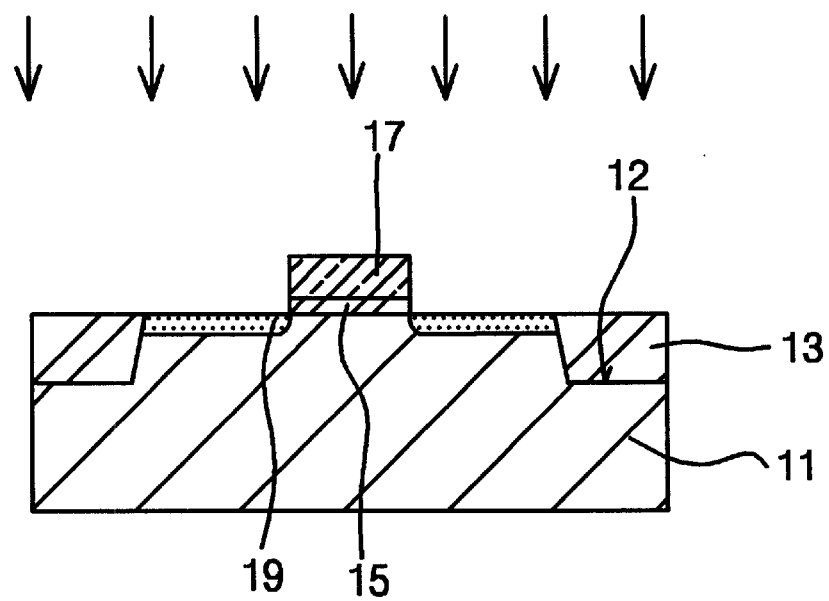

Referring to FIG. 1A, a field oxide layer 13 defining an active area and a field area of a device is formed on a p-typed semiconductor substrate 11 by shallow trench isolation (hereinafter abbreviated STI). In this case, the field oxide layer 13 is formed by forming a pad oxide layer(not shown in the drawing) and a mask layer(not shown in the drawing) which expose the field area on the semiconductor substrate 11, by forming trenches 12 which are slant to a predetermined degree by carrying out an anisotropic etch such as reactive ion etching(hereinafter abbreviated RIE) and the like on the exposed parts of the semiconductor substrate 11, by filling the trenches with silicon oxide, then by removing the pad oxide and mask layers.

After a gate oxide layer 15 has been formed on the active area of the semiconductor substrate 11, polysilicon doped with impurities is deposited on the gate insulating layer 15 by chemical vapor deposition(hereinafter abbreviated CVD). Then, a gate 17 is formed by patterning the polysilicon to remain on a predetermined portion of the semiconductor substrate 11 by photolithography including anisotropic etches such as RME and the like.

Lightly doped regions 19 for LDD(lightly doped drain) regions are formed by implanting ions lightly into the exposed portions of the semiconductor substrate 11 with n typed impurities in use of the gate 17 as a mask.

Figure 1B:
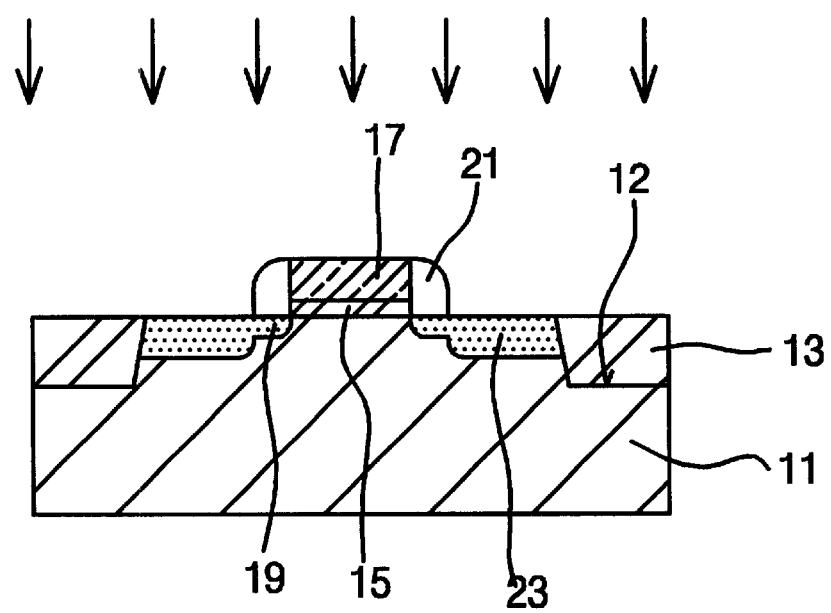

Referring to FIG. 1B, a sidewall spacer 21 is formed at the sides of the gate 17. In this case, the sidewall spacer 21 is formed by deposing silicon oxide on the semiconductor substrate 11 to cover the field oxide layer 13 and gate 17 by CVD, then by etching back the silicon oxide to have the semiconductor substrate 11 exposed by RIE.

Heavily doped regions 23 for a source and a drain region are formed by implanting with n typed impurity ions heavily into the exposed portions of the semiconductor substrate 11 in use of the gate 17 and sidewall spacer 21 as a mask.

Figure 1C:
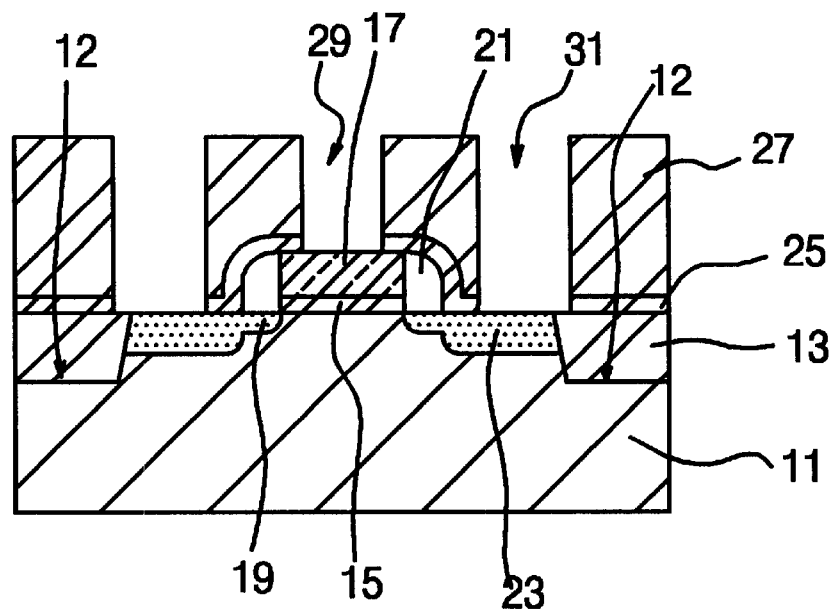

Referring to FIG. 1C, a first insulating interlayer 25 is formed by depositing silicon nitride on the semiconductor substrate 11 to cover the field oxide layer 13, gate 17, and sidewall spacer 21 by CVD. And, a second insulating interlayer 27 is formed by depositing silicon oxide or BPSG(boro phospho silicate glass) on the first insulating interlayer 25 by CVD or by coating the first insulating layer 25 with SOG(spin on glass).

A first and a second contact hole 29 and 31 exposing the gate and heavily doped regions 23 respectively are formed by patterning the second and first insulating interlayers 27 and 25 by photolithography including anisotropic etch such as RIE and the like. As the thickness of the second insulating interlayer 27 is irregular due to the height difference between the gate 17 and heavily doped regions 23, the first and second contact holes 29 and 31 are formed by etching the second insulating interlayer 27 sufficiently, which means that the second insulating interlayer 27 is overetched to expose the first insulating interlayer 25 corresponding to the heavily doped regions 23, then by etching the first insulating interlayer 25.

In this case, as the etch rate of the first insulating interlayer 25 is different from that of the second insulating interlayer 27, the first insulating interlayer 25 as an etch stop layer prevents the field oxide layer 13 from being etched in spite of etching the second insulating interlayer 27 sufficiently.

Figure 1D:
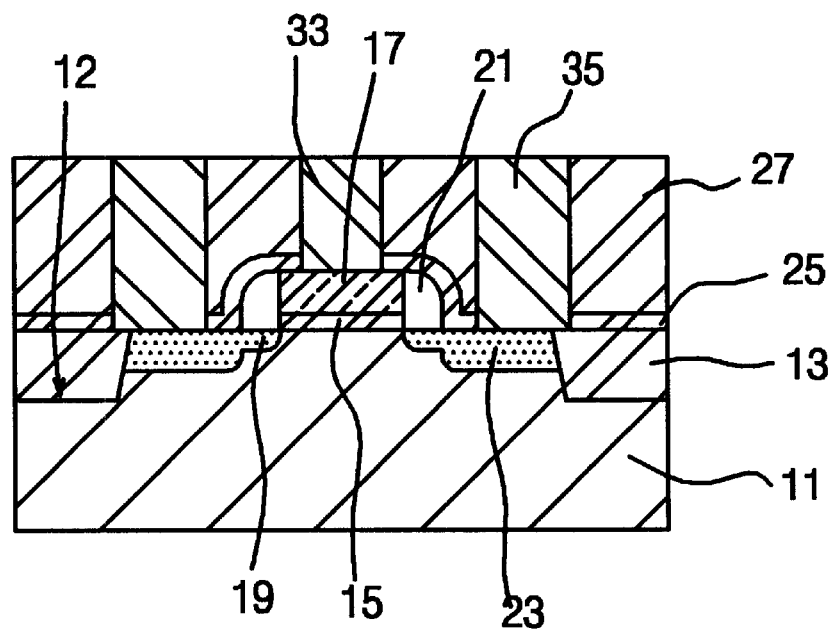

Referring to FIG. 1D, an electrically-conductive substance such as polysilicon, Al, and the like is deposited on the second insulating interlayer 27 to be contacted with the gate 17 and heavily of doped regions 23 through the first and second contact holes 29 and 31. Then, a first and a second plug 33 and 35 are formed in the first and second contact holes 29 and 31 respectively by removing the electrically-conductive substance to expose the surface of the second insulating interlayer 27 by chemical-mechanical polishing (hereinafter abbreviated CMP).

The above-mentioned method of fabricating a semiconductor device prevents the field oxide layer from being etched by overetching the second insulating interlayer to expose portions of the first insulating interlayer corresponding to the heavily doped regions for forming the first and second contact holes exposing the gate and heavily doped regions and by etching the first insulating interlayer successively.

Unfortunately, the method of fabricating a semiconductor device of the related art causes leakage current due to the difference in heat expansion coefficient between the semiconductor substrate and the first insulating interlayer of silicon nitride as well as stress caused by lattice mismatch.

SUMMARY OF THE INVENTION

Accordingly, the present invention is directed to a method of fabricating a semiconductor device that substantially obviates one or more of the proulenis due to limitations and disadvantages of the related art.

The object of the present invention is to provide a method of fabricating a semiconductor device which prevents the leakage current occurrence by avoiding the stress due to the contact between the semiconductor substrate and insulating interlayer.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming a field oxide layer defining an active area and a field area on a semiconductor substrate of a first conductive type, forming a gate on the active area of the semiconductor substrate by inserting a gate insulating layer between the semiconductor substrate and the gate, forming impurity regions of a second conductive type in the semiconductor substrate in use of the gate as a mask, forming a first insulating interlayer on the semiconductor substrate by depositing an insulator of which heat expansion coefficient and lattice mismatch are less than those of the semiconductor substrate to cover the field oxide layer and the gate, forming a second insulating interlayer on the first insulating interlayer by depositing another insulator of which etch rate is different from that of the first insulating interlayer, forming a third insulating interlayer on the second insulating interlayer by depositing another insulator of which etch rate is different from that of the second insulating interlayer, and forming a first contact hole and second contact holes exposing the gate and heavily doped regions respectively by patterning the third to first insulating interlayer successively by photolithography.

In another aspect, the present invention includes the steps of forming a field oxide layer defining an active area and a field area on a semiconductor substrate of a first conductive type, forming a gate on the active area of the semiconductor substrate by inserting a gate insulating layer between the semiconductor substrate and the gate, forming a sidewall spacer at a side of the gate, forming lightly doped regions of a second conductive type in exposed portions of the semiconductor substrate, forming heavily doped regions of the second conductive type in the semiconductor substrate in use of the gate as a mask wherein the heavily doped regions are overlapped with the lightly doped regions, forming a first insulating interlayer on the semiconductor substrate by depositing an insulator of which heat expansion coefficient and lattice mismatch are less than those of the semiconductor substrate to cover the field oxide layer and the gate, forming a second insulating interlayer on the first insulating interlayer by depositing another insulator of which etch rate is different from that of the first insulating interlayer, forming a third insulating interlayer on the second insulating interlayer by depositing another insulator of which etch rate is different from that of the second insulating interlayer, forming a first contact hole and second contact holes exposing the gate and heavily doped regions respectively by patterning the third to first insulating interlayer successively by photolithography, and forming first and second plugs in the first and second contact holes.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention. In the drawings:

FIG. 1A to FIG. 1D show cross-sectional views of fabricating a semiconductor device according to a related art; and FIG. 2A to FIG. 2D show cross-sectional views of fabricating a semiconductor device according to the present invention.

DETAILED DESCRIPTION OF PREFERRED EMBODIMENTS

Reference will now be made in detail to the preferred embodiments of the present invention, examples of which are illustrated in the accompanying drawings.

FIG. 2A to FIG. 2D show cross-sectional views of fabricating a semiconductor device according to the present invention.

Figure 2A:
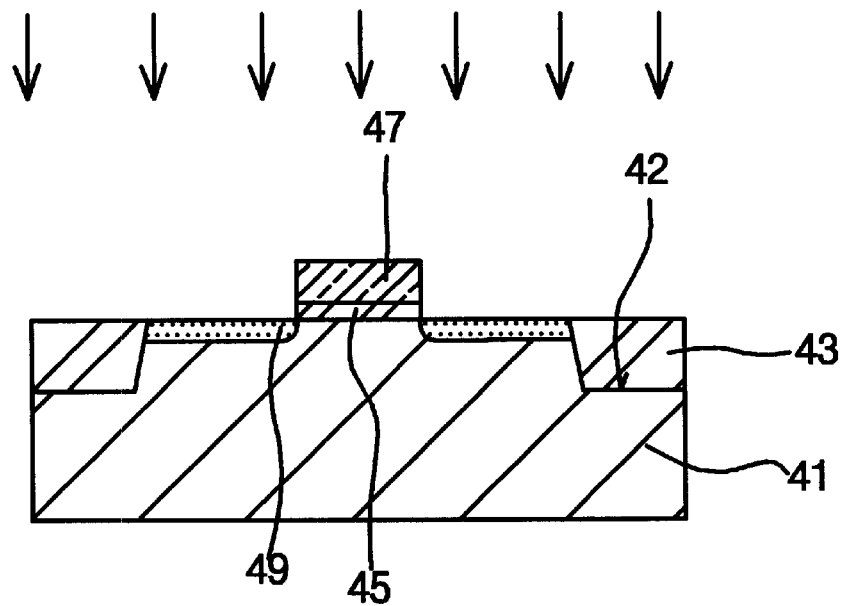

Referring to FIG. 2A, a field oxide layer 43 defining an active area and a field area of a device is formed on a p-typed semiconductor substrate 41 by shallow trench isolation (hereinafter abbreviated STI). In this case, the field oxide layer 43 is formed by forming a pad oxide layer(not shown in the drawing) and a mask layer(not shown in the drawing) which expose the field area on the semiconductor substrate 41, by forming trenches 42 which are slant to a predetermined degree by carrying out an anisotropic etch such as RIE and the like on the exposed parts of the semiconductor substrate 41, by filling the trenches with silicon oxide, then by removing the pad oxide and mask layers. Besides, the field oxide layer 41 may be formed by local oxidation of silicon(LOCOS).

After a gate oxide layer 45 has been formed on the active area of the semiconductor substrate 41, polysilicon doped with impurities is deposited on the gate insulating layer 45 by CVD. Then, a gate 47 is formed by patterning the polysilicon to remain on a predetermined portion of the semiconductor substrate 41 by photolithography including anisotropic etches such as RIE and the like.

Lightly doped regions 49 for LDD regions are formed by implanting ions lightly into the exposed portions of the semiconductor substrate 41 with n typed impurities such as P, As, etc, in use of the gate 17 as a mask.

Figure 2B:
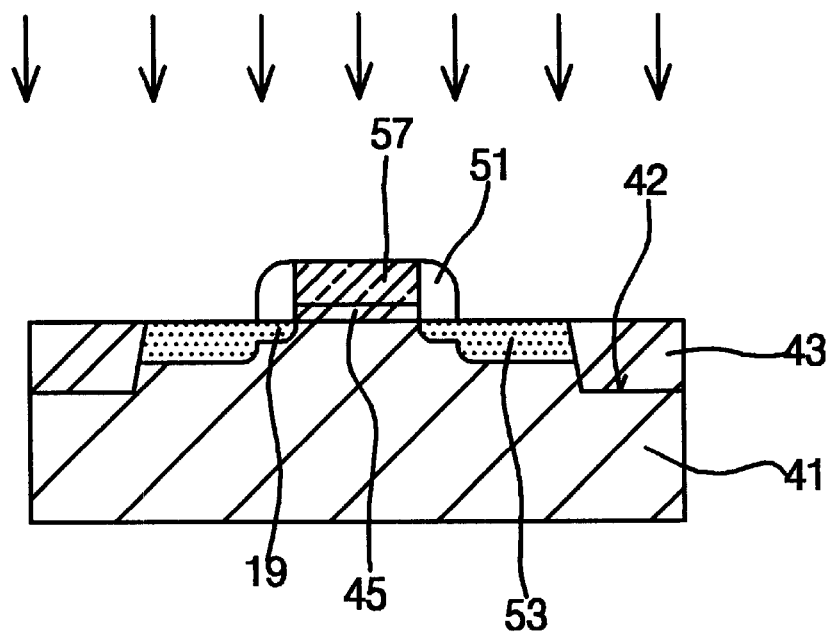

Referring to FIG. 2B, a sidewall spacer 51 is formed at the sides of the gate 47. In this case, the sidewall spacer 51 is formed by deposing silicon oxide on the semiconductor substrate 41 to cover the field oxide layer 43 and gate 47 by CVD, then by etching back the silicon oxide to have the semiconductor substrate 41 exposed by RIE.

Heavily doped regions 53 for a source and a drain region are formed by implanting with n typed impurity ions such as P, As, etc, heavily into the exposed portions of the semiconductor substrate 41 in use of the gate 47 and sidewall spacer 51 as a mask.

Figure 2C:
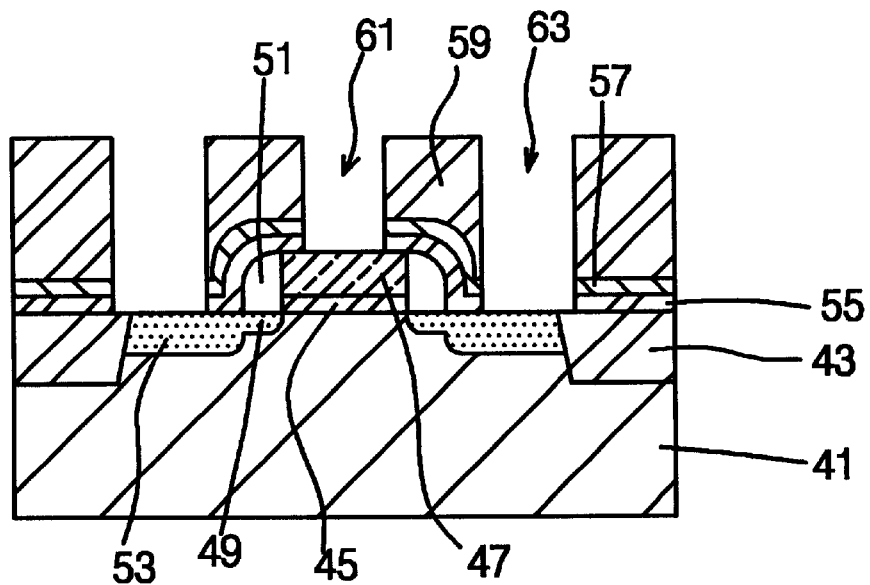

Referring to FIG. 2C, a first insulating interlayer 55 100 to 300 Å thick is formed by depositing silicon oxide on the semiconductor substrate 41 to cover the field oxide layer 43, gate 47, and sidewall spacer 51 by CVD. In this case, a heat expansion coefficient and lattice mismatch of silicon oxide for the first insulating layer 55 against the semiconductor substrate 41 are less than those of silicon nitride, thereby reducing leakage current due to stress.

And, a second insulating interlayer 57 100 to 300 Å thick is formed by depositing silicon nitride of which etch rate is different that of silicon oxide on the first insulating layer 55 by CVD.

Then, a third insulating interlayer 59 500 to 10000 Å thick is formed by depositing silicon oxide or BPSG(boro phospho silicate glass) on the second insulating interlayer 57 by CVD or by coating the second insulating layer 57 with SOG(spin on glass).

As the surface of the third insulating interlayer 59 becomes even, the portions of the third insulating interlayer 59 corresponding to the gate 47 and the heavily doped regions 53 differ in thickness. Namely, the portion of the third insulating interlayer 59 corresponding to the heavily doped regions 59 is thicker than the other portion corresponding to the gate 47. In this case, the third insulating interlayer 59 may be formed with at least double layers of the above-mentioned substances.

A first and a second contact hole 61 and 63 exposing the gate 47 and heavily doped regions 53 respectively are formed by patterning the third, second, and first insulating interlayers 59, 57, and 55 successively by photolithography including an anisotropic etch such as RIE and the like.

When the first and second contact holes 61 and 63 are formed, portions of the second insulating layer 57 corresponding to the heavily doped regions 53 are exposed by overetching the third insulating interlayer 59 with a gas of C2F6 or C4F8 which is mixed with O2. In this case, the second insulating layer 57 of which etch rate is different from that of the third insulating layer 59 is used as an etch-stop layer.

After the exposed portions of the second insulating interlayer 57 has been etched by C2HF6O2, the first and second contact holes 61 and 63 are formed by etching the first insulating layer 55 to expose the semiconductor substrate 41 in use of the gas of C2F6 or C4F8 which is mixed with O2. which has been used for etching the third insulating interlayer 59. In this case, the field oxide layer 43 is prevented from being damaged because it is easy to control the etch-end point owing to the thin first insulating interlayer 55.

Figure 2D:
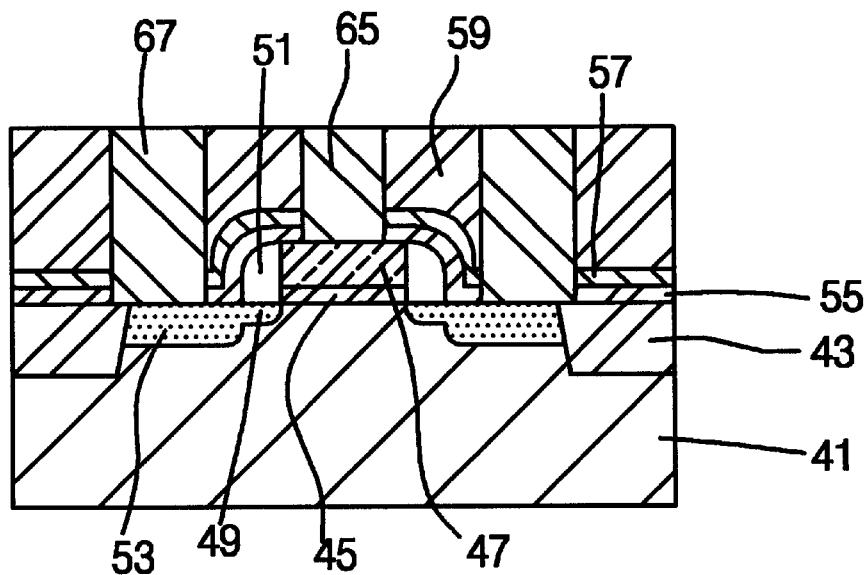

Referring to FIG. 2D, an electrically-conductive substance such as polysilicon, Al, and the like is deposited on the third insulating interlayer 59 by CVD to be contacted with the gate 47 and heavily doped regions 53 through the first and second contact holes 61 and 63. Then, a first and a second plug 65 and 67 are formed in the first and second contact holes 61 and 63 respectively by removing the electrically-conductive substance to expose the surface of the third insulating interlayer 59 by CMP.

As mentioned in the above description of the method of fabricating a semiconductor device of the present invention, a first insulating layer of silicon oxide of which heat expansion coefficient and lattice mismatch are less than those of silicon nitride is formed on a semiconductor substrate, and a second insulating interlayer of silicon nitride used as an etch-stop layer and a third insulating interlayer of silicon oxide are formed on the first insulating interlayer successively.

And, a first and a second contact hole exposing a gate and heavily doped regions are formed by patterning the third to first insulating interlayers by photolithography in order, wherein the third insulating interlayer are overetched to expose a portion of the second insulating interlayer corresponding to the heavily doped regions. In this case, the second insulating interlayer used as an etch-stop layer prevents the first insulating interlayer and field oxide layer from being etched.

Accordingly, the present invention prevents the leakage current occurrence by avoiding the stress due to the contact between the semiconductor substrate and insulating interlayer.

It will be apparent to those skilled in the art that various modifications and variations can be made in a method of fabricating a semiconductor device of the present invention without departing from the spirit or scope of the inventions. Thus, it is intended that the present invention cover the modifications and variations of this invention provided they come within the scope of the appended claims and equivalents.

What is claimed is:

1. A method of fabricating a semiconductor device comprising the steps of:
   forming a field oxide layer defining an active area and a field area on a semiconductor substrate of a first conductive type;
   forming a gate on the active area of the semiconductor substrate by inserting a gate insulating layer between the semiconductor substrate and the gate;
   forming impurity regions of a second conductive type in the semiconductor substrate in use of the gate as a mask;
   forming a first insulating interlayer on the semiconductor substrate by depositing an insulator of which heat expansion coefficient and lattice mismatch are less than those of the semiconductor substrate to cover the field oxide layer and the gate;
   forming a second insulating interlayer on the first insulating interlayer by depositing another insulator of which etch rate is different from that of the first insulating interlayer;
   forming a third insulating interlayer on the second insulating interlayer by depositing another insulator of which etch rate is different from that of the second insulating interlayer; and
   forming a first contact hole and second contact holes exposing the gate and heavily doped regions respectively by patterning the third to first insulating interlayer successively by photolithography.

2. The method of fabricating a semiconductor device according to claim 1, wherein the field oxide layer is formed by shallow trench isolation or by local oxidation of silicon.

3. The method of fabricating a semiconductor device according to claim 1, wherein the first insulating interlayer is formed by depositing silicon oxide 100 to 300 Å thick.

4. The method of fabricating a semiconductor device according to claim 3, wherein the first insulating interlayer is etched by a mixed gas of (C2F6+O2) or (C4F8+O2).

5. The method of fabricating a semiconductor device according to claim 1, wherein the second insulating interlayer is formed by depositing silicon nitride 100 to 300 Å thick.

6. The method of fabricating a semiconductor device according to claim 5, wherein the second insulating interlayer is etched by C2HF6O2.

7. The method of fabricating a semiconductor device according to claim 1, wherein the third insulating interlayer is formed by depositing silicon oxide or boro phospho silicate glass or by coating with spin on glass.

8. The method of fabricating a semiconductor device according to claim 7, wherein the third insulating interlayer of a single layer is formed with one of silicon oxide, boro phospho silicate glass, or spin on glass or wherein the third insulating interlayer of at least double layers is formed with silicon oxide, boro phospho silicate glass and spin on glass.

9. The method of fabricating a semiconductor device according to claim 7, wherein a surface of the third insulating interlayer is formed to be even.

10. The method of fabricating a semiconductor device according to claim 7, wherein the third insulating interlayer is etched by a mixed gas of (C2F6+O2) or (C4F8+O2).

11. The method of fabricating a semiconductor device according to claim 10, wherein the third insulating interlayer is overetched to expose the second insulating interlayer corresponding to the heavily doped regions.

12. The method of fabricating a semiconductor device according to claim 1, the method further comprising the step of forming first and second plugs in the first and second contact holes.

13. A method of fabricating a semiconductor device comprising the steps of
    forming a field oxide layer defining an active area and a field area on a semiconductor substrate of a first conductive type;
    forming a gate on the active area of the semiconductor substrate by inserting a gate insulating layer between the semiconductor substrate and the gate;
    forming a sidewall spacer at a side of the gate;
    forming lightly doped regions of a second conductive type in exposed portions of the semiconductor substrate;
    forming heavily doped regions of the second conductive type in the semiconductor substrate in use of the gate as a mask wherein the heavily doped regions are overlapped with the lightly doped regions;
    forming a first insulating interlayer on the semiconductor substrate by depositing an insulator of which heat expansion coefficient and lattice mismatch are less than those of the semiconductor substrate to cover the field oxide layer and the gate;
    forming a second insulating interlayer on the first insulating interlayer by depositing another insulator of which etch rate is different from that of the first insulating interlayer;
    forming a third insulating interlayer on the second insulating interlayer by depositing another insulator of which etch rate is different from that of the second insulating interlayer;
    forming a first contact hole and second contact holes exposing the gate and heavily doped regions respectively by patterning the third to first insulating interlayer successively by photolithography; and
    forming first and second plugs in the first and second contact holes.

* * * * *